US009991338B2

(12) United States Patent
Grivna

(10) Patent No.: US 9,991,338 B2
(45) Date of Patent: Jun. 5, 2018

(54) ELECTRONIC DEVICE INCLUDING A CONDUCTIVE STRUCTURE SURROUNDED BY AN INSULATING STRUCTURE

(71) Applicant: SEMICONDUCTOR COMPONENTS INDUSTRIES, LLC, Phoenix, AZ (US)

(72) Inventor: Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/251,984

(22) Filed: Aug. 30, 2016

(65) Prior Publication Data

US 2017/0084705 A1 Mar. 23, 2017

Related U.S. Application Data

(60) Provisional application No. 62/219,779, filed on Sep. 17, 2015.

(51) Int. Cl.
*H01L 29/06* (2006.01)
*H01L 21/762* (2006.01)
(Continued)

(52) U.S. Cl.
CPC .... *H01L 29/0649* (2013.01); *H01L 21/76232* (2013.01); *H01L 28/10* (2013.01); *H01L 29/0692* (2013.01); *H01L 29/401* (2013.01); *H01L 29/407* (2013.01); *H01L 29/408* (2013.01)

(58) Field of Classification Search
None
See application file for complete search history.

(56) References Cited

U.S. PATENT DOCUMENTS 6,621,136 B2  9/2003  Grivna
6,683,343 B2  1/2004  Matsudai et al.
(Continued)

OTHER PUBLICATIONS

Chung, J.W. et al. "Seamless On-Wafer Integration of Si(100) MOSFETs and GaN HEMTs." IEEE Electron Device Letter, vol. 30, No. 10, Oct. 2009, pp. 1015-1017.
(Continued)

*Primary Examiner* — Ali Naraghi
(74) *Attorney, Agent, or Firm* — Abel Law Group, LLP

(57) ABSTRACT

An electronic device can include a substrate and an insulating structure laterally surrounded by the substrate. In an aspect, the electronic device can include a first conductive structure or an active region that is laterally surrounded by the insulating structure and the substrate. In another aspect, the electronic device can include an inductor surrounded by the insulating structure. In a further aspect, a process of forming an electronic device can include patterning a substrate to define a trench and a plurality of features, including a first feature and a second feature, within the trench; forming a first insulating layer within the trench; removing the first feature to create a first cavity; forming a second insulating layer to at least partly fill the first cavity; removing the second feature to create a second cavity; and forming a conductive or semiconductor structure within the second cavity.

20 Claims, 9 Drawing Sheets

(51) Int. Cl.
*H01L 49/02* (2006.01)
*H01L 29/40* (2006.01)

(56) References Cited

U.S. PATENT DOCUMENTS

| | | | |
|---|---|---|---|
| 6,818,525 | B1 | 11/2004 | Durham et al. |
| 7,087,925 | B2 | 8/2006 | Grivna |
| 7,253,477 | B2 | 8/2007 | Loechelt et al. |
| 7,452,796 | B2 * | 11/2008 | Davies .................. H01L 21/764 438/599 |
| 7,518,185 | B2 | 4/2009 | Hadizad et al. |
| 7,579,632 | B2 | 8/2009 | Salih et al. |
| 7,781,310 | B2 | 8/2010 | Grivna |
| 7,842,969 | B2 | 11/2010 | Marreiro et al. |
| 7,989,319 | B2 | 8/2011 | Grivna |
| 8,012,857 | B2 | 9/2011 | Grivna et al. |
| 8,384,231 | B2 | 2/2013 | Grivna et al. |
| 8,492,260 | B2 | 7/2013 | Parsey, Jr. et al. |
| 8,859,396 | B2 | 10/2014 | Grivna et al. |
| 8,981,533 | B2 | 3/2015 | Grivna |
| 9,117,802 | B2 | 8/2015 | Parsey, Jr. et al. |
| 9,142,665 | B2 | 9/2015 | Hirler et al. |
| 9,391,135 | B1 | 7/2016 | Grivna et al. |
| 2002/0030225 | A1 | 3/2002 | Nakamura et al. |
| 2002/0137264 | A1 | 9/2002 | Kao et al. |
| 2003/0062588 | A1 | 4/2003 | Grivna |
| 2005/0176192 | A1 | 8/2005 | Hshieh |
| 2010/0230745 | A1 * | 9/2010 | Saito .................. H01L 29/0619 257/329 |
| 2011/0140228 | A1 | 6/2011 | Wang et al. |
| 2012/0187527 | A1 | 7/2012 | Guitart et al. |
| 2013/0277807 | A1 | 10/2013 | Parsey, Jr. et al. |
| 2014/0070375 | A1 | 3/2014 | Grivna |
| 2015/0235866 | A1 | 8/2015 | Nakamura |
| 2015/0357437 | A1 | 12/2015 | Vellei |
| 2015/0380247 | A1 | 12/2015 | Horii et al. |
| 2016/0172464 | A1 | 6/2016 | Grivna |
| 2017/0084687 | A1 | 3/2017 | Grivna et al. |

OTHER PUBLICATIONS

Lindemann, A., "A New IGBT with Reverse Blocking Capability." Entwurf fur EPE Conference, Graz; IXAN0049; pp. 1-7 (2001).

Bakir, Muhannad S., "Interconnect and Heterogeneous Microsystem Integration Technologies". School of Electrical and Computer Engineering, Georgia Institute of Technology, 2015, slides 18 and 26.

Yang, Rongbo, "Through-Silicon-Via Inductor: Is it Real of Just a Fantasy?". Masters Thesis, Missouri University of Science and Technology, 2013, pp. 1-45.

Vanackern, Gary, et al., "On-Chip 3D Indcutors Using Thru-Wafer Vias". College of Engineering, Boise State Universiy, 2012, p. 20.

Motto, E. R. et al., "Application Characteristics of an Experimental RB-IGBT (Reverse Blocking IGBT) Module". IEEE, 0-7803-8480-03; pp. 1-5 (2004).

Jiang, Hongrui, et al., "Fabrication of Thick Silicon Dioxide Sacrificial and Isolation Blocks in a Silicon Substrate". Journal of Micromechanics and Microengineering, 12, (2002), pp. 87-95.

Thadesar, Paragkumar A., et al., "Low-Loss Silicon Interposer for Three-Dimensional System Integration with Embedded Microfluidic Cooling". 2014 Symposium on VLSI Technology Digest of Technical Paper, 2014 IEEE, pp. 156-157.

Non-Final Office Action for U.S. Appl. No. 15/252,009, dated Dec. 6, 2017, pp. 1-10.

* cited by examiner

ELECTRONIC DEVICE INCLUDING A CONDUCTIVE STRUCTURE SURROUNDED BY AN INSULATING STRUCTURE

CROSS-REFERENCE TO RELATED APPLICATION

This application claims priority under 35 U.S.C. § 119(e) to U.S. patent application Ser. No. 62/219,779 entitled "Deep Trench Isolation Devices and Methods," by Grivna et al., filed Sep. 17, 2015, which is assigned to the current assignee hereof and incorporated herein by reference in its entirety.

FIELD OF THE DISCLOSURE

The present disclosure relates to electronic devices including insulating structures and processes of forming such electronic devices.

RELATED ART

Isolation structures are used to control high electrical fields that can be present within the die. The isolation structures can include alternating n-type and p-type regions, insulating layers, or a combination thereof. The alternating regions can limit the flexibility in the design of the electronic device. In another embodiment, a large isolation region can be formed using two insulating layers and a single mask. The large isolation region may require a large amount of insulating material to be deposited and limit equipment throughput. Further improvement in electronic devices and flexibility in designs and high equipment throughput are desired.

BRIEF DESCRIPTION OF THE DRAWINGS

Embodiments are illustrated by way of example and are not limited in the accompanying figures.

Figure 1:
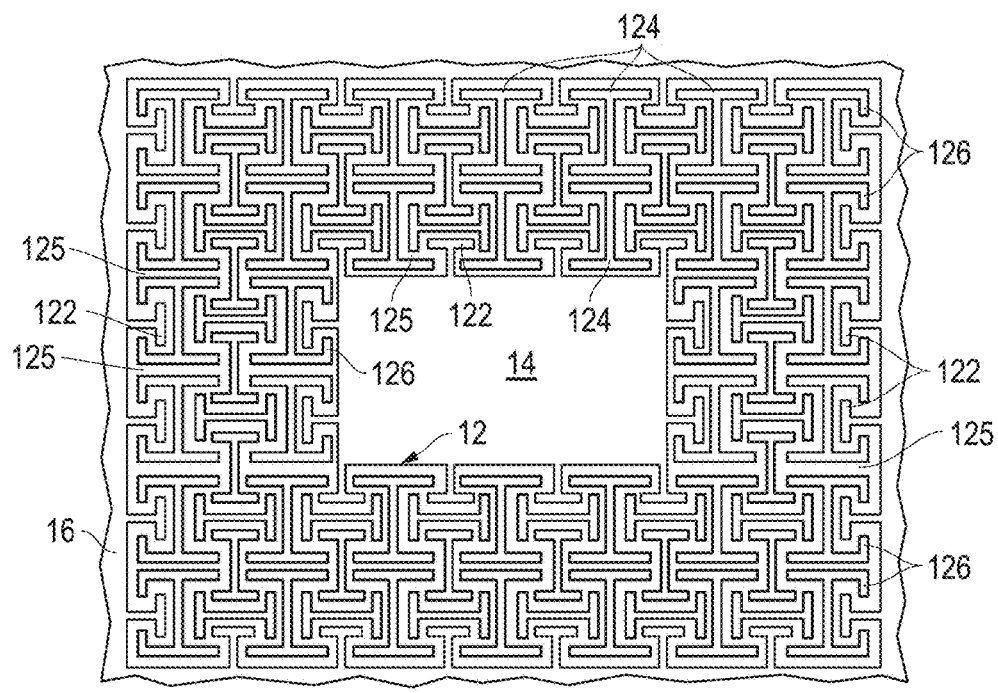
FIG. 1 includes an illustration of a top view of a portion of a workpiece including an insulating structure having anchors along opposite sides of the insulating structure.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention. To the extent terms defined below are differ from those in U.S. Pat. No. 8,492,260, the terms as defined below govern in this document.

The term "electronic component" is intended to mean a component that is or can readily be made part of a circuit. An example of an electronic component includes an active component or a passive component, such as a capacitor, resistor, diode, or the like. An electronic component does not include an interconnect, conductive plug, a via, or the like whose function is to electrically connect at least two electronic components or an electronic component and a terminal to each other. The two electronic components or the combination of the electronic component may be on the same substrate or workpiece or on different substrates or workpieces.

The term "elemental metal" is intended to mean to a metal that is not part of an alloy or a compound. Examples of elemental metals include W, Cu, Al, Ag, Pt, Ir, and the like.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include an insulating structure that allows for relatively complex or large conductor or electronic components to be formed. In an embodiment, the electronic device can include a substrate and an insulating structure that is laterally surrounded by the substrate. The electronic device can further include a conductive structure or an active region that is laterally surrounded by the insulating structure and the substrate, wherein the conductive structure or active region is laterally spaced apart from the substrate by at least 4 microns. In another embodiment, the electronic device can include an insulating structure that includes an embedded void, and an inductor laterally surrounded by the insulating structure and having a core that includes an insulating material or a magnetic material and does not include any portion of a semiconductor substrate.

In another aspect, a process of forming an electronic device can include patterning a substrate to define a trench and a plurality of features, including a first feature and a second feature, within the trench; forming a first insulating layer within the trench; removing the first feature after forming the first insulating layer to create a first cavity; forming a second insulating layer to at least partly fill the first cavity; removing the second feature after forming the first insulating layer to create a second cavity; and forming a first conductive or semiconductor structure within the second cavity.

Figure 2:
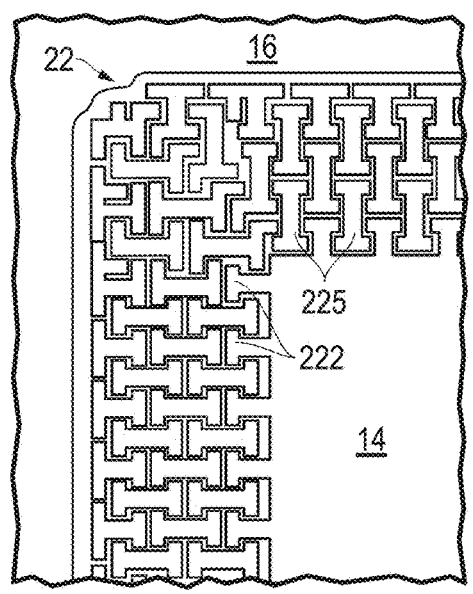
FIG. 2 includes an illustration of a top view of a portion of a workpiece including a pair of insulating structures each having s smooth outer side with a clipped outer corner and an inner side with anchors.

In the description below, FIGS. 1 and 2 illustrate relatively simpler structures, FIGS. 3 to 8 illustrate some exemplary, non-limiting shapes for pillars and anchors, FIGS. 9 to 17 illustrate a process flow. The description and FIGS. 9 to 17 aid in the understanding of the concepts from which more complicated structures and designs can be implemented. FIGS. 19 to 25 illustrate particular structures that are relatively more complicated structures or form inductors.

FIG. 1 includes an illustration of a top view of a workpiece. An insulating structure 12 separates an interior region 14 from a peripheral region 16 of the workpiece. In an embodiment, the interior region 14 and the peripheral region 16 can include portions of the substrate, and the insulating region 12 can be formed within a trench extending into the substrate. In an embodiment, the interior region 14 can be an active region in which electronic components may be formed. In another embodiment, the interior region 14 can be a thru-substrate via. In a particular embodiment, the interior region 14 can include a heavily doped portion of a substrate, an elemental metal, a metal alloy, a composite of metal-containing films, or the like. In FIG. 1, the interior region 14 is laterally surrounded by the insulating structure 12, which is laterally surrounded by the peripheral region 16. In a finished electronic device, the substrate may or may not underlie the insulating region 14. The insulating structure 12 allows the interior region 14 and the peripheral region 16 to be spaced apart from each other by at least 4 microns, at least 7 microns, at least 11 microns, or even more.

The insulating structure 12 can include regional anchors 122 that extend from the regions 14 and 16, pillar anchors 125, and pillars 124 and 126. The anchors 122 and 125 help to reduce the likelihood that the insulating structure 12 separates from other parts of the workpiece. The regional anchors 122 include portions of the adjacent regions 14 and 16 that extend into the insulating structure 12. The anchors 125 include portions of the insulating structure 12 that extend into the interior region 14 and the peripheral region 16, and more particularly, the anchors 125 include portions of the pillars 124 and 126 and insulating layer within the trench that surrounds the pillars 124 and 126. In an embodiment, the anchors 122 and 125 have complementary shapes, and in a further embodiment, the anchors 122 and 125 are interlocking features. In another embodiment, anchors 122 and 125 lie along only one of the regions 14 or 16, and in a further embodiment, no anchors 122 or 125 are used.

Many of the pillars 124 and 126 have I-beam shapes that include a pair of flanges spaced apart from each other by a web. Along the straight sections of the insulating structure, the pillars 124 are substantially identical to each other, and in a particular embodiment, the flange widths are substantially the same. Along some of the sides of the insulating structure 12, the I-beam shapes of the pillars 126 may be modified to keep maximum spacing within the trench from exceeding a predetermined value. The pillars 126 are adjacent to substrate anchors 122 and have one or more portions extending from one or both flanges of I-beam shape.

The insulating structure 12 in FIG. 1 includes squared outer corners. FIG. 2 includes an illustration of an embodiment in which the insulating structures 22 has stepped outer corners. In a further embodiment, an insulating structure may have rounded outer corners, or another shape. The particular shape may be tailored for a particular application.

In FIG. 2, the anchors 222 and 225 are formed along an inner side of an insulating structure 22, and no anchoring structures are formed along the outer side of the insulating structure 22. In an embodiment, the anchors 222 and 225 have complementary shapes, and in a further embodiment, the anchors 222 and 225 are interlocking features.

Anchors 122 and 125 and anchors 222 and 225 allow for better mechanical integrity. Anchors may have localized points, such as near ends of the anchors, which can generate a locally higher electrical field. Thus, the lack of an anchor along the outer side of the insulating structure 22 may allow for a higher electrical field before breakdown occurs as compared to the same insulating structure 22 except with anchors along the outer side of the insulating structure 22. In another embodiment, the anchors 222 and 225 are not present, and the lack of any anchors along both the inner and outer sides of the insulating structure 22 may allow for an even higher electrical field before breakdown as compared to the insulating structure 22 in FIG. 2. Thus, skilled artisans may have a tradeoff between better electronic characteristics and mechanical integrity. After reading this specification, skilled artisans will be able to determine design that works best for a particular application.

Figure 3:
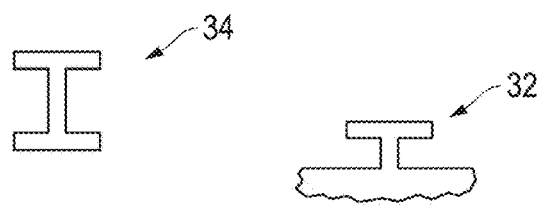
FIGS. 3 to 8 include illustrations of top views of exemplary shapes of pillars and anchors.
Figure 4:
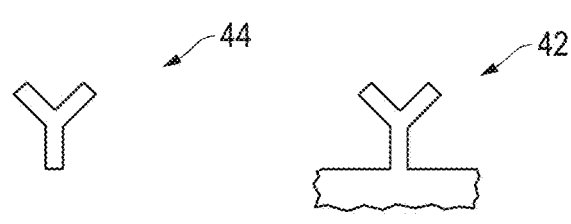
Figure 5:
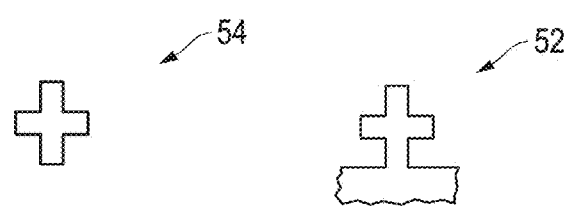
Figure 6:
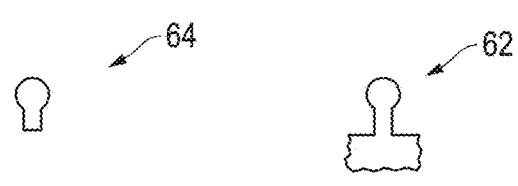
Figure 7:
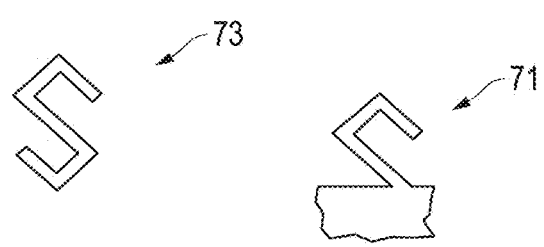
Figure 8:
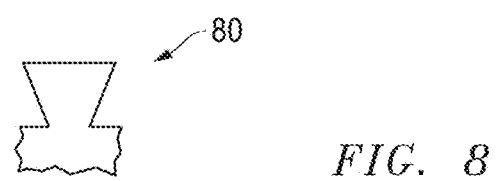

FIGS. 3 to 8 include exemplary shapes for pillars and anchors. In FIGS. 3 to 7, the left-hand drawing illustrates a shape of a pillar that would be spaced apart from a sidewall of the trench, and the right-hand drawing illustrates a corresponding feature that extends from a sidewall of the trench that can be used such a pillar. In FIG. 3, the pillar 34 has an I-shape, and the anchor 32 has a T-shape, which is a cutoff portion of the I-shape. In FIG. 4, each of the pillar 44 and anchor 42 has a Y-shape. In FIG. 5, each of the pillar 54 and the anchor 52 has a square cross shape. In FIG. 6, each of the pillar 64 and anchor 62 has a bulb-and-stick shape. In FIG. 7, the pillar 73 has a modified S-shape, and the anchor 71 has a hook, which is a cutoff portion of the modified S-shape. In FIG. 8, a feature 80 can be in the shape of a dovetail that is similar to the shape used in joints at corners in wooden furniture. The anchors as illustrated in FIGS. 3 to 8 are portions of substrates that extend from body portions of the substrates. Many of the anchors in FIGS. 3 to 8 have wider portions and narrower portions that are disposed between the body portions of the substrates and the wider portions. The anchor 71 is in the shape of a hook. Thus, the anchoring structures have shapes that help to resist separation of the substrates from the insulating structures. After reading this specification, others designs of anchors can be used without departing from the teachings of this specification.

Figure 9:
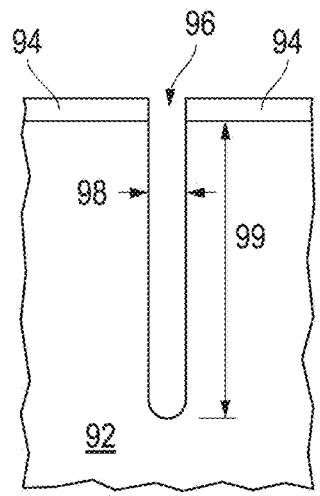
FIGS. 9 and 10 include illustrations of a cross-sectional view and a top view, respectively, of a portion of a workpiece after patterning a substrate to define a trench.
Figure 11:
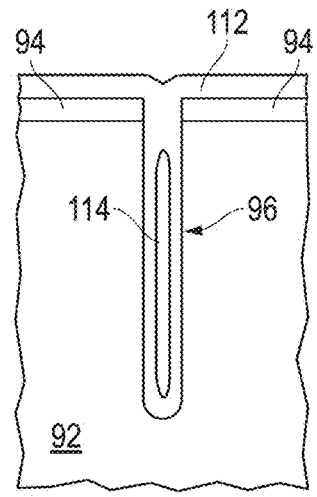
FIG. 11 includes an illustration of a cross-sectional view of the workpiece of FIG. 10 after forming an insulating layer having an embedded void within the trench.
Figure 10:
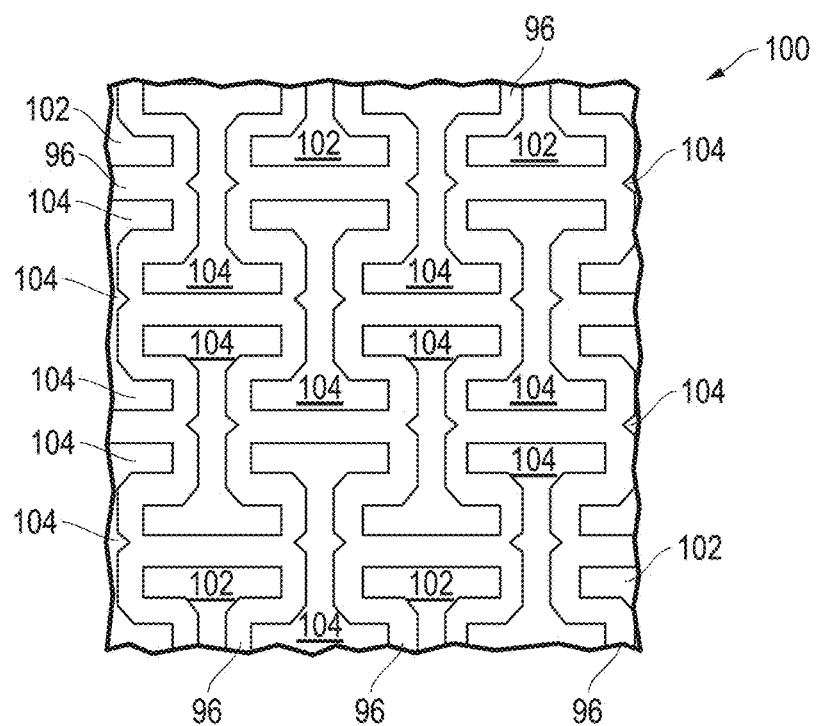
Figure 12:
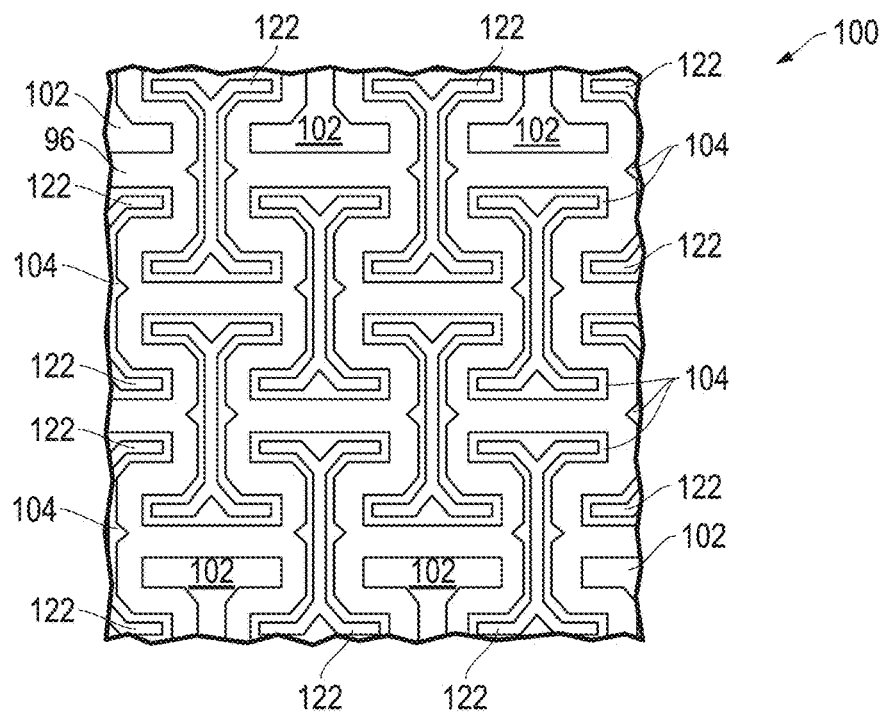
FIG. 12 includes an illustration of a top view of the workpiece of FIG. 11 after patterning the insulating layer.
Figure 13:
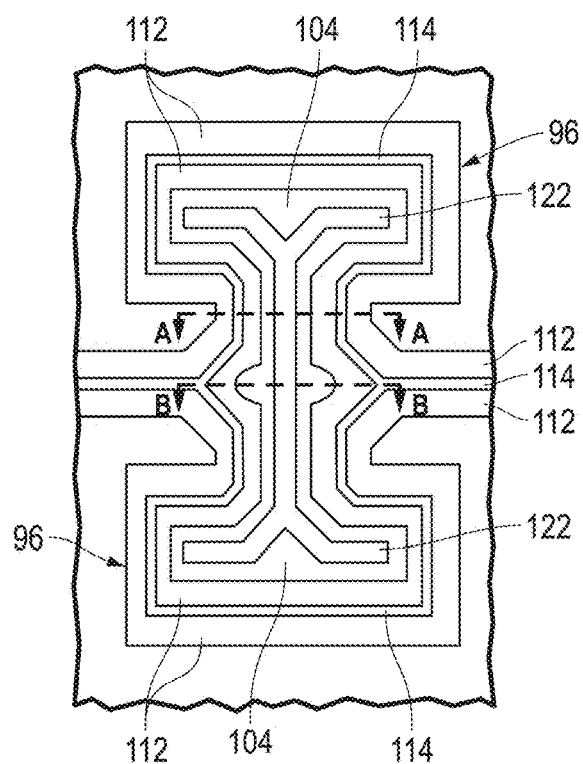
FIGS. 13 to 15 include illustrations of views of the workpiece of FIG. 12 at a different location as compared to illustrated in FIG. 12 after removing portions of the pillars to define cavities.

FIGS. 9 to 17 include process cross sections illustrating formation of a part of an insulating structure. FIGS. 10 and 12 correspond to a location on the workpiece, and FIG. 13 corresponds to another location. FIGS. 10 and 12 illustrate positional relationships between pillars, features, and the trench, and FIG. 13 illustrates an individual pillar structure. FIGS. 10 and 12 illustrate better how the structure in FIG. 13 is integrated into an insulating structure.

FIG. 9 includes a cross-sectional view of a portion of a workpiece after a substrate 92 is patterned to define trench 96. The substrate 92 can principally include a semiconductor material, such as a Group 14 element (for example, Si, Ge, C) or a compound semiconductor material. The compound semiconductor material can include Group 14 elements (for example, SiC or SiGe), a III-V compound, or a II-VI compound. The III-V compound can include III-N, III-P, III-As, and the III element may be selected from Al, Ga, In, or any combination thereof. The II-VI compound can include II-O, II-S, II-Se, or II-Te, and the II element can include Zn, Cd, Hg, Pb, or the like.

In the embodiment as illustrated, a hardmask layer 94 is formed over the substrate 92 and includes one or more films, each of which may include an oxide, nitride, oxynitride, another dielectric, or the like. The hardmask layer 94 is patterned to define openings, and the substrate 92 is patterned to define the trench 96. FIG. 10 includes a top view of the workpiece at this point in the process flow. Within the insulating structure 100, portions of the substrate 92 that are not removed are anchors 102 and pillars 104, which have an I-beam shape in this embodiment.

In an embodiment, a subsequently-formed insulating layer will form embedded voids within the trenches. The pillars 104 have extensions along the webs of the I-beams to help the maximum spacing with the trench 96 from becoming too large, which would otherwise complicate the subsequently-formed insulating layer. The maximum spacing may be expressed in terms of spacings 98 within the trench 96 between different parts of the substrate 92, such as between pillars 104, between a pillar 104 and an anchor 102, or between a body portion of the substrate 92 (for example, interior region 14 or peripheral region 16 in FIG. 1). For this particular embodiment, the spacings 98 may be at most 2 microns, at most 5 microns, or at most 10 microns.

In another embodiment, embedded voids will not be formed throughout the trench 96. In this embodiment, the maximum spacing between pillars 104 and between pillars 104 and anchors 102 may be controlled by another factor, such as dishing that could occur if a chemical mechanical polishing operation would be performed. Accordingly, the spacings 98 may be higher than any of the previously recited values and may exceed 20 microns.

If the spacings 98 are too small, a trench depth 99 may not be deep enough or a sufficient amount of insulating material of a subsequently-formed insulating layer may not form within the trench 96. In a particular embodiment, the spacings 98 are at least 1 micron.

The depth 99 of the trench 96 may depend in part on the application. In an embodiment, the insulating structure 96 is used in conjunction with a power device, such as a transistor designed to operate at a nominal voltage of 50 V or higher. As the voltage and the corresponding electrical field are relatively smaller, the trench 96 can be shallower, and when relative greater, the trench may be deeper. If the insulating structure becomes exposed along the backside of a finished electronic device, the trench 96 may need to be even deeper. For many applications, the depth 99 is in a range of 11 microns to 200 microns, and may be in a range of 60 microns to 120 microns.

After forming the trench 96, the hardmask layer 94 may remain over the substrate 92 or may be removed (not illustrated).

FIG. 11 includes an illustration after forming an insulating layer 112 over the hardmask layer 94. The insulating layer 112 can include one or more films, each of which can include an oxide, nitride, oxynitride, or another dielectric. In the embodiment illustrated in FIG. 11, an embedded void 114 is formed within the insulating layer 112. The insulating layer 112 can be deposited along exposed surfaces of the workpiece, including the bottom and sidewalls of the trench 96. The deposition rate is greater near the top of the trench 96, and thus, the trench 96 is sealed off as the deposition continues. The embedded void 114 allows for the formation of a sealed trench without having to completely fill the trench 96, which improves equipment throughput and reduces overall stress. In such an embodiment, the insulating layer 112 can be formed to a thickness of at least 0.5 micron, as measured over the hardmask layer 94 spaced away from the trench 96.

In another embodiment, a significant portion of the trench 96 may not have an embedded void 114 and such portion is completely filled with the insulating layer 112. The thickness of the insulating layer 112 may be a little more than (for example, 1% to 20% more than) (1) half of the width of such portion of the trench 96 or (2) the depth 99 of the trench, whichever is of the two is smaller, to ensure the trench 96 is sufficiently filled. For example, if such portion has a width of 20 microns and a depth of 80 microns, half of the width, 10 microns, is less than the depth of 80 microns. Thus, the insulating layer 96 may be deposited in a range of 10.1 microns to 12 microns. In any of the foregoing embodiments, the pillars 104 may remain within the insulating structure 100 and formation of the insulating structure is substantially completed.

Figure 14:
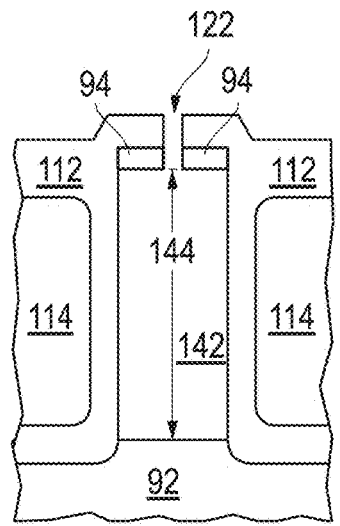
Figure 15:
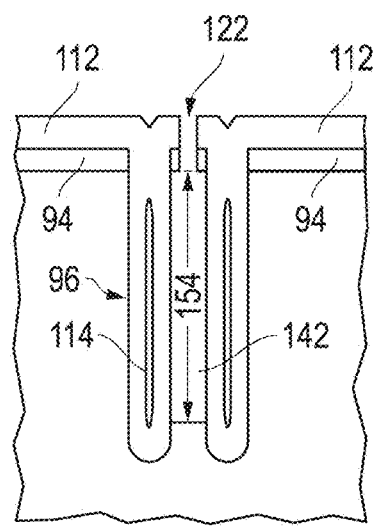
Figure 16:
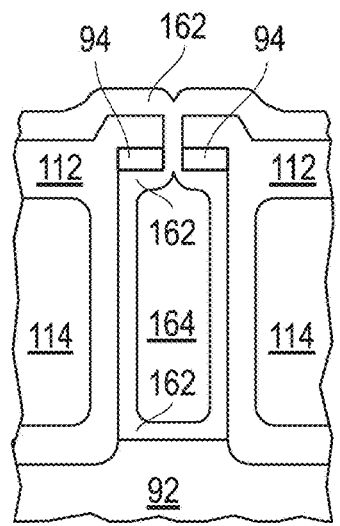
FIGS. 16 and 17 include illustrations of cross-sectional views of portions of the workpiece of FIGS. 13 to 15 after forming another insulating layer having embedded voids within the cavities.
Figure 17:
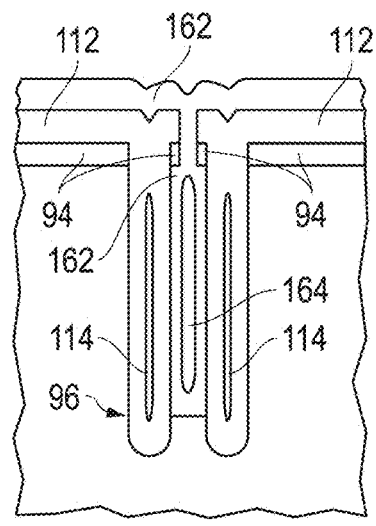

In another embodiment, one or more of the pillars 104 may be at least partly removed. FIGS. 12 to 15 include illustrations with respect to patterning the hardmask and insulating layers 94 and 112 and removing at least portions of pillars 104 to define cavities, while leaving the anchors 102 in place. Referring briefly to FIG. 13, the illustrations of FIGS. 14 and 16 are along sectioning line A-A in FIG. 13, and FIGS. 15 and 17 are along sectioning line B-B in FIG. 13. In FIGS. 12 and 13, portions of the insulating layer 112 within the trench 96 are not illustrated to simplify understanding the positional relationships between the trench 96, pillars 104 and anchors 102.

A masking layer (not illustrated) is formed over the insulating layer 112 and defines openings over portions of the hardmask and insulating layers 94 and 112. The hardmask and insulating layers 94 and 112 are patterned to define openings 122 that expose portions of the pillars 104, as illustrated in FIGS. 12 and 13. In the embodiment as illustrated, portions of all of the pillars 104 are exposed, and none of the anchors 102 are exposed, as they remain covered by the hardmask and insulating layers 94 and 112. In another embodiment (not illustrated), at least one pillar 104 may be unexposed (no opening over such pillar(s) 104).

The shape and maximum spacings within the openings 122 have similar considerations as described with respect to the shape and maximum spacings for the trench 96. Thus, the previously described considerations and values for the spacings of the trench 96 may be used for the openings 122. In an embodiment, embedded voids in a subsequently-formed insulating layer will be formed in a manner similar to the embedded voids 114 within the insulating layer 112, and therefore, the spacings within the openings 122 can have the values as previously described for the spacings 98 of the trench 96 with respect to an embodiment in which embedded voids are later formed. In another embodiment, an embedded void within an insulating layer will not be formed. In this embodiment, the maximum spacing within openings 122 may be controlled by another factor, such as dishing that could occur if a chemical mechanical polishing operation would be performed. Accordingly, the spacings within the openings 122 may be higher than values when embedded voids are to be formed within a subsequently-formed insulating layer.

At least portions of the pillars 104 are removed to define cavities, including cavity 142 as illustrated in FIGS. 14 and 15. In an embodiment, an isotropic wet or dry etchant is used to remove the exposed portion of the pillars 104. The isotropic etchant allows portions of the pillars 104 that are covered by the hardmask and insulating layers 94 and 112 to be removed. Depths 144 and 154 may vary slightly from location to location within the cavity 142. The etching may continue as long as the insulating layer 112 within the trench 96 is not significantly undercut. In an embodiment, at least a part of the pillars 104 remain between portions of the insulating layer 112 within the trench 96 to help with mechanical support of the insulating layer 112 within the trench 96. Although there is no minimum amount of the pillars 104 to remove, at least 10% of the pillars 104 may be removed. Thus, the depths 144 and 154 may in a range of 10% to 110% of the heights of the pillars 104 (corresponding to the depth of the trench 96).

In the embodiment illustrated in FIGS. 16 and 17, an embedded void 164 is formed within an insulating layer 162. The insulating layer 162 can be deposited along exposed surfaces of the workpiece, including the bottom and sidewalls of the cavities, including cavity 142. The deposition rate is greater near the opening 122, and thus, the cavity 142 is sealed off as the deposition continues. The embedded void 142 allows for the formation of a sealed cavity without having to completely fill the cavity 142, which improves equipment throughput and reduces overall stress. In such an embodiment, the insulating layer 162 can be formed to a thickness of at least 0.4 micron, as measured over the insulating layer 112 spaced away from the cavity 142.

In another embodiment (not illustrated in FIGS. 16 and 17), a cavity may not have an embedded void and such portion is completely filled with the insulating layer 162. The thickness of the insulating layer 162 may be determined using similar considerations as previously described with respect to an embodiment in which the insulating layer 112 completely fills a significant portion of the trench 96.

At this point in the process, the formation of the insulating structure is substantially complete. When the interior region 14 is an active region, electronic components within the interior region 14 or within both of the interior region 14 and the peripheral region 16 may have been formed before forming the insulating structure or may be formed after forming the insulating structure.

Figure 18:
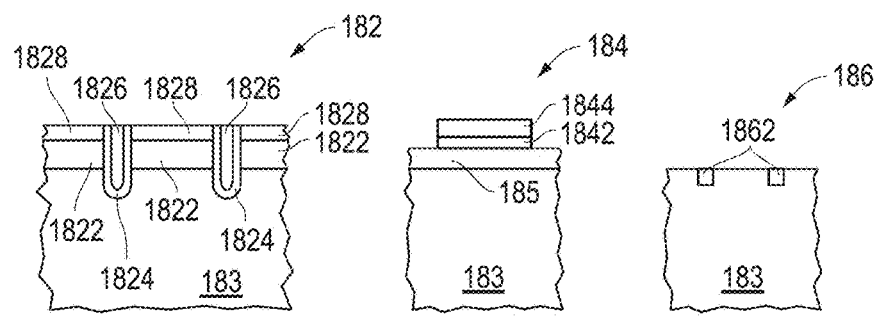
FIG. 18 includes illustrations of cross-sectional views of exemplary components that may be formed within an active region of a workpiece.

Electronic components within the active region 14 or within both of the active and peripheral regions 14 and 16 may have been formed before forming the insulating structure or may be formed after forming the insulating structure. FIG. 18 includes some exemplary, non-limiting electronic components that can be formed. A transistor 182 includes a body region 1822 that includes the channel region for the transistor 182. The workpiece is patterned to remove portions of the body region 1822 and the semiconductor layer 183 to form openings where gate structures are to be formed. A gate dielectric layer 1824 is formed within the openings, and gate electrodes 1826 are formed within the openings. A source region 1828 is formed along the surface and has the same conductivity type as the semiconductor layer 183 and opposite the body region 1822. A body contact region for the body region 1822 is formed at a location outside of the illustration in FIG. 18. The portion of the semiconductor layer 183 within FIG. 18 is a drift region for the transistor 182, and a portion of a substrate 181 (not illustrated in FIG. 18) underlying the drift region is a heavily doped drain region for the transistor 182.

FIG. 18 further includes a capacitor 184, wherein a heavily doped region 185 is an electrode for the capacitor. An insulating layer 1842 is formed over the heavily doped region 185, and another electrode 1844 of the capacitor 182 is formed over the insulating layer 1842. FIG. 18 still further includes a resistor 186, which is a portion of the semiconductor layer 183 lying between heavily doped regions 1862 that allow ohmic contacts to be formed for the resistor 186. The semiconductor layer 183 and the heavily doped regions 1862 have the same conductivity type. Other types of electronic components may be used but are not illustrated.

Figure 19:
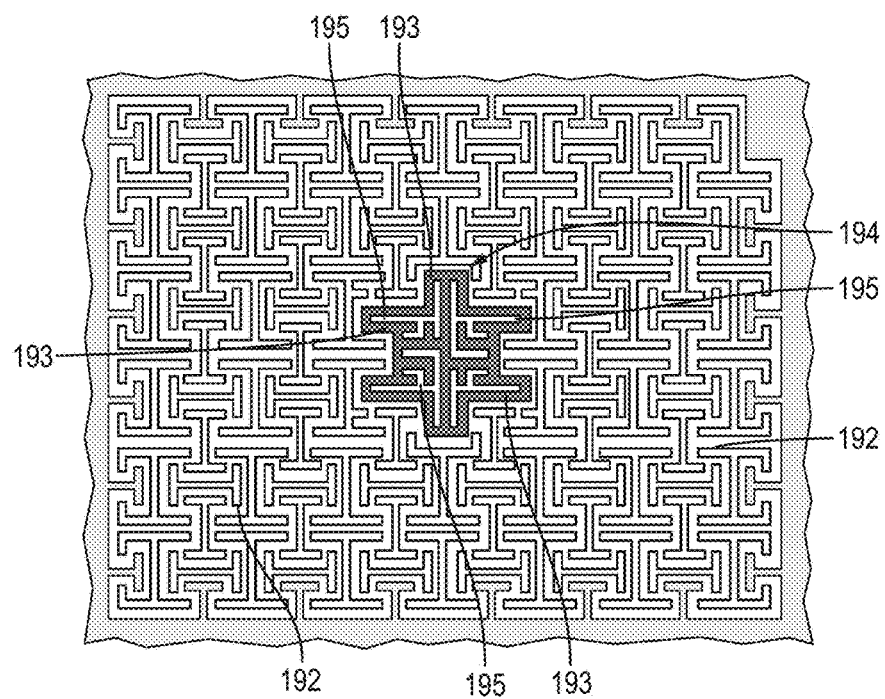
FIG. 19 includes a plan view of a through-substrate via that is laterally surrounded by an insulating structure.

More complicated structures and electronic components can be formed in which some pillars can be conductive or replaced by a conductive or a semiconductor material. FIG. 19 includes an illustration of a conductive structure 194 within an insulating structure 192. In the embodiment illustrated, the conductive structure 194 is a thru-substrate via that includes a conductive material 193 and portions 195 of an insulating material embedded within the conductive structure 194. The insulating material embedded within the conductive structure 194 can include the insulating layer used when filling the trench.

In forming the conductive structure 194, an insulating layer, similar to the insulating layer 112, is formed as previously described. Some of this insulating layer will remain within the subsequently formed conductive structure 194. The insulating layer can be patterned to define an opening corresponding to the conductive structure 194. At least a portion of the substrate under the opening is removed to form a cavity. The conductive material 193 can be deposited within the cavity. Similar to the insulating layer, the conductive material 193 may or may not have an embedded void. If needed or desired any portion of the conductive material overlying the insulating layer can be removed. At this point in the process, the conductive structure 194 is formed, but the insulating structure 192 is only partly formed.

In forming the remainder of the insulating structure 192, the insulating layer is patterned to define openings where at least portions of the remaining pillars will be removed. At least portions of the pillars are removed as previously described, leaving anchors and the conductive structure 194 covered. Another insulating layer, similar to the insulating layer 162, is formed as previously described. From a plan view, the distance between the conductive structure 194 and the anchors or other portions of the substrate are separated by at least 4 microns, at least 11 microns, or at least 20 microns of the insulating structure 192. Thus, the conductive structure 194 may be at a high voltage (for example, greater than 150 V), transport a signal that would otherwise cause noise within the substrate, generate a significant magnetic field, provide another suitable electronic performance improvement, or any combination thereof without causing a significant adverse affect due to the spacing provided by the insulating structure 192.

In another embodiment, the conductive structure 194 may include a heavily doped portion of the substrate. The processing sequence above would be modified to exclude removal of the portion of the pillar to form the cavity and filling the cavity with a conductive material. The portion of the substrate corresponding to the conductive structure 194 would be covered, along with the anchors, when removing at least portions of the other pillars.

Figure 20:
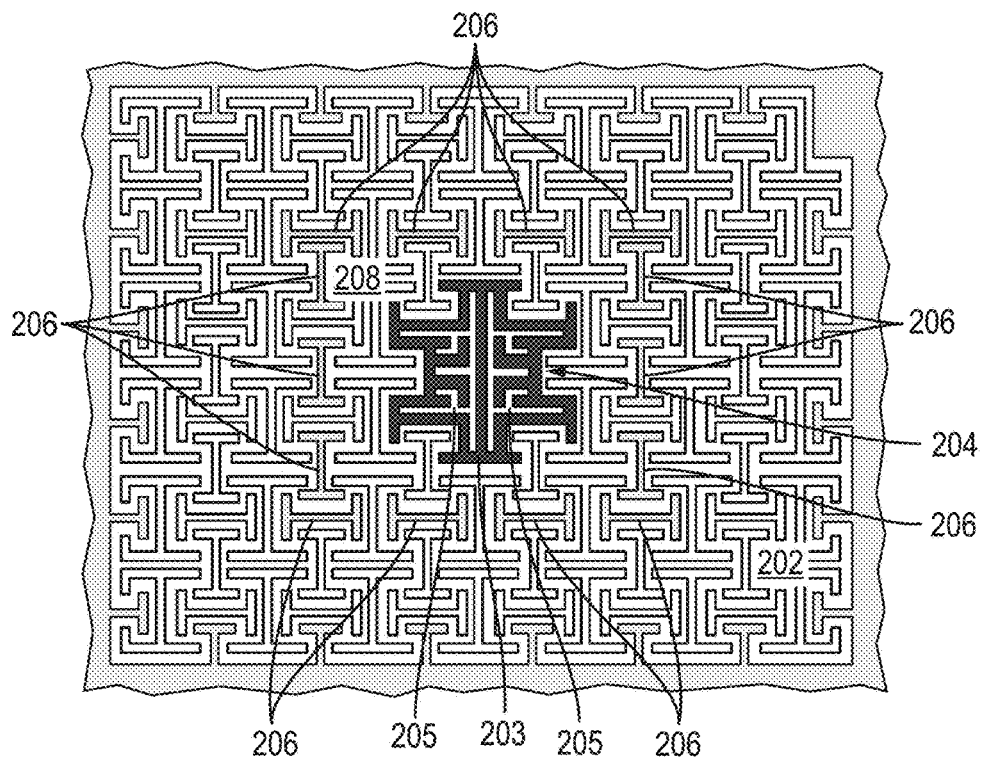
FIG. 20 includes a plan view of a coaxial conductor that is laterally surrounded by an insulating structure.

FIG. 20 includes an illustration of coaxial conductor 200 that includes an inner conductive structure 204 and an outer ring of conductive structures 206 surrounded by an insulating structure 202. An insulating region 208 is disposed between the inner conductive structure 204 and the outer ring of conductive structures 206. In the embodiment as illustrated, no portion of the substrate is disposed between the inner conductive structure 204 and the outer ring of conductive structures 206.

The inner conductive structure 204 and the outer ring of conductive structures 206 can include any of the materials and be formed using any of the techniques as previously described with respect to the conductive structure 194. Similar to the conductive structure 194, the inner conductive structure 204 includes a conductive material 203 and portions 205 of an insulating material are embedded within the inner conductive structure 204. The portions 205 may or may not have an embedded void. In the embodiment illustrated, each of the inner conductive structure 204 and the outer ring of conductive structures 206 is a thru-substrate conductor. In an embodiment, each of the conductive structures 204 and 206 include a metal-containing material, and in another embodiment, each of the conductive structures 204 and 206 include a heavily doped portion of the substrate. In a further embodiment, the inner conductive structure 204 includes a metal-containing material, and the outer ring of conductive structures 206 includes one or more heavily doped portions of the substrate, or vice versa. The insulating structure 202, the insulating region 208, or both have a composition and can be formed using the same processing operations as the insulating structure 192. The concepts as described herein can be extended to an n-axial connector, wherein n is a whole number. Although in theory, n can be any finite number, n is typically at most 9.

Figure 21:
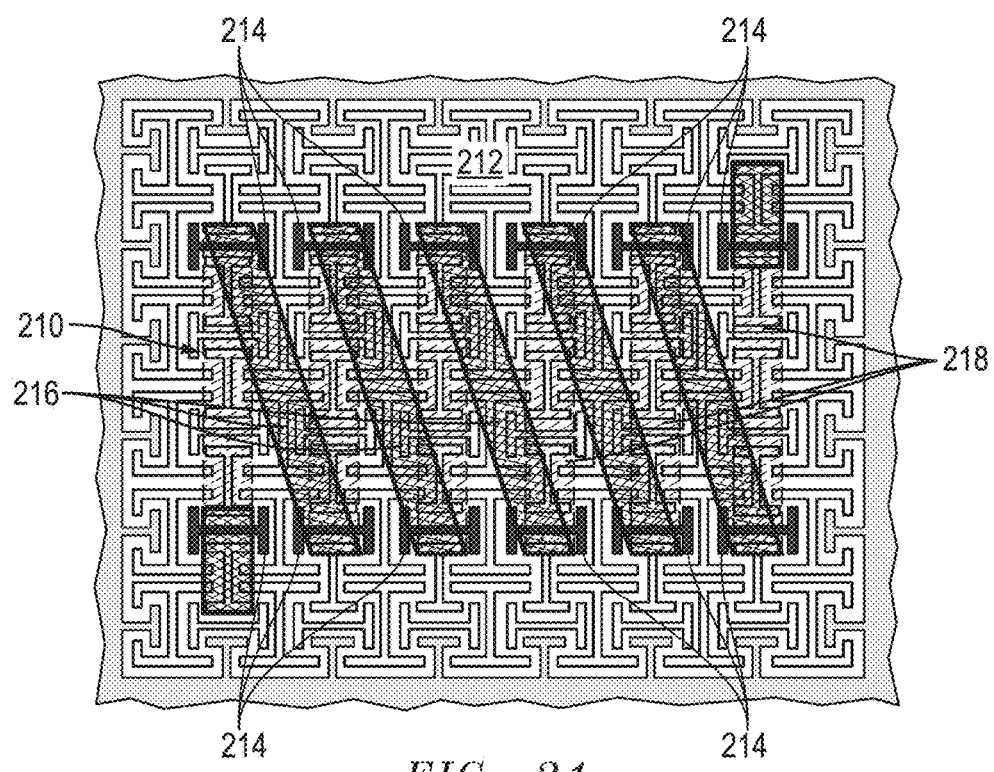
FIG. 21 includes a plan view of a solenoid.

FIGS. 21 to 25 illustrate embodiments with different types of inductors that can be formed using insulating structures as previously described and illustrated. In FIG. 21, a solenoid 210, which is a type of an inductor, is surrounded by an insulating structure 212. The solenoid 210 includes conductive structures 214 that can include any of the materials and are formed in a manner as previously described with respect to the conductive structures 194, 204, or 206. Along one side of the die, such as along the top, conductive straps 216 are diagonally oriented and electrically connect a conductive structure 214 in one column to another conductive structure 214 in an adjacent column. Along the opposite side of the die, such as along the bottom, conductive straps 218 are vertically oriented and electrically connect conductive structures 216 within the same column. In the embodiment as illustrated, the core of the solenoid 210 includes the insulating material of the insulating structure 212. When the insulating structure 212 includes embedded voids, the core of the solenoid 210 likewise includes embedded voids. In the embodiment illustrated, the solenoid 210 does not include any of the substrate material within the core.

Figure 22:
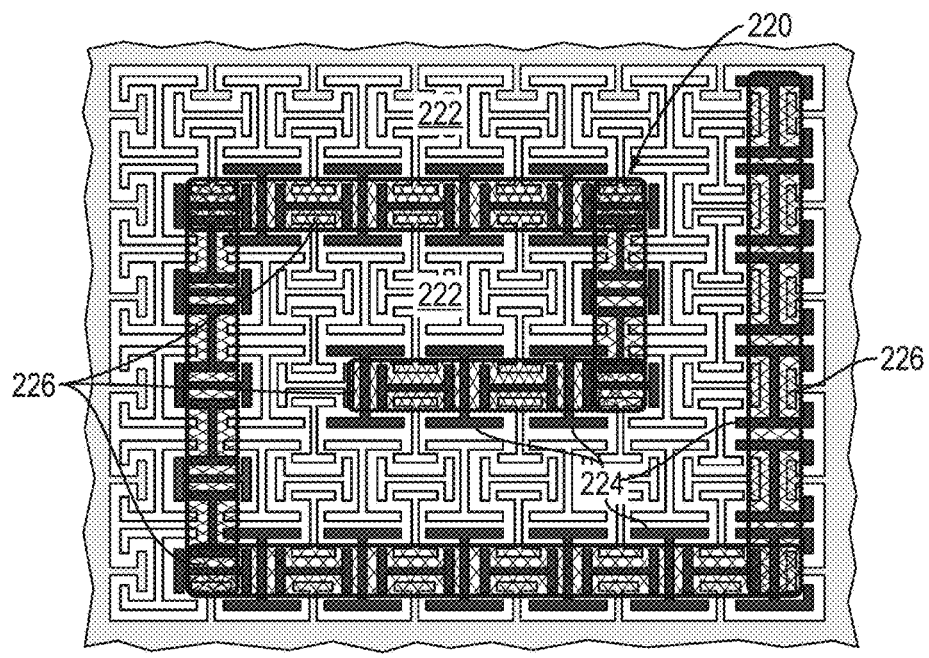
FIG. 22 includes a plan view of a planar spiral inductor.

In FIG. 22, a planar spiral inductor 220 has a core that includes part of the insulating structure 222. The planar inductor 220 includes a conductive structure 224 that can include any of the materials and be formed in a manner as previously described with respect to the conductive structures 194, 204, or 206. A conductive strap 226 is electrically connected to the conductive structure 224 along a side of the die, and another conductive strap (not illustrated) is electrically connected to the conductive structure 224 along the opposite side of the die. The conductive strap(s) may or may not overlie the substrate anchors. In the embodiment as illustrated, the core of the planar inductor 220 includes the insulating material of the insulating structure 222. When the insulating structure 222 includes embedded voids, the core of the planar inductor 220 likewise includes embedded voids. In the embodiment illustrated, the planar inductor 222 does not include any of the substrate material within the core.

In a further embodiment, no conductive strap or only a conductive strap along one side of the die may be used. In another embodiment, the conductive structure 224 can be replaced by discrete conductive structures, wherein the discrete conductive structures are oriented in a pattern corresponding to the planar inductor 220, and the discrete conductive structures are connected by one or both conductive straps. For example, conductive structures similar to the outer ring of conductive structures 206 in FIG. 20 may be used, and the pattern of the individual conductive structures are arranged in a spiral. Such individual conductive structures can be electrically connected together by one or more conductive straps.

Referring briefly to FIG. 20, the outer ring of conductive structures 206 can be replaced by a single conductive structure having connecting sections similar to the conductive structure 224 in FIG. 22.

Figure 23:
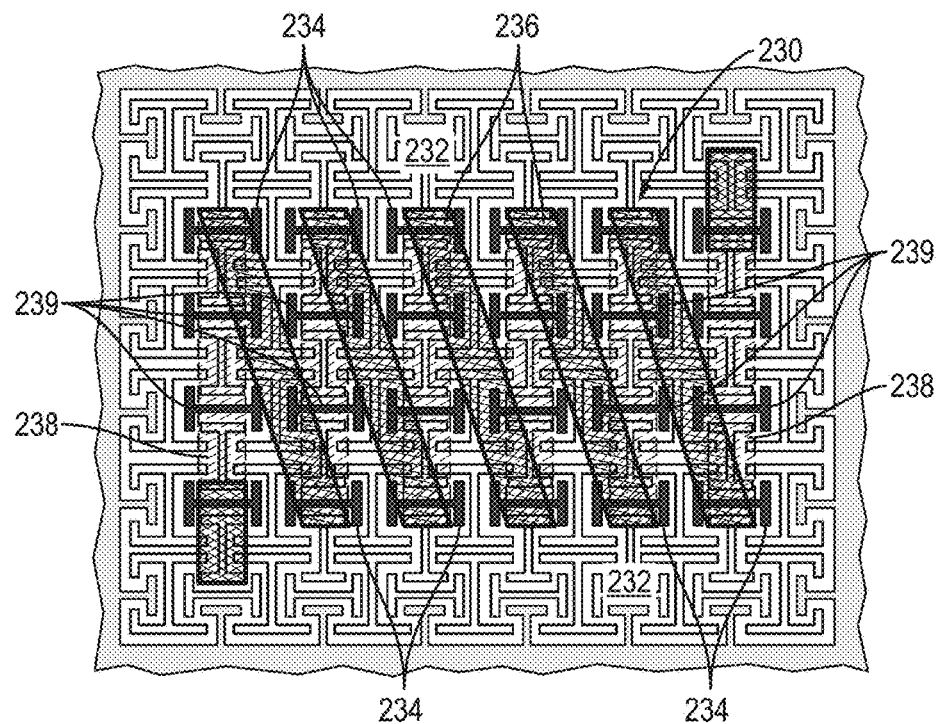
FIGS. 23 and 24 include plan views of solenoids each having a core that includes a magnetic material.

The inductors can have a core that includes magnetic material. FIG. 23 includes a solenoid 230 surrounded by an insulating structure 232. The solenoid 230 includes conductive structures 234 and conductive straps 236 and 238 that are similar to the conductive structures 214 and conductive straps 216 and 218 as previously described with respect to the solenoid 210 in FIG. 21. Two rows of structures 239 can include a magnetic material, such as Fe, Co, Ni, or an alloy including Fe, Co, Ni, or any combination thereof. The conductive straps 236 and 238 are not electrically connected to the structures 239 that include the magnetic material. Similar to the solenoid 210, the solenoid 230 includes portions of an insulating layer that may or may not include embedded voids. In the embodiment illustrated, none of a semiconductor substrate is part of the core of the solenoid 230.

Figure 24:
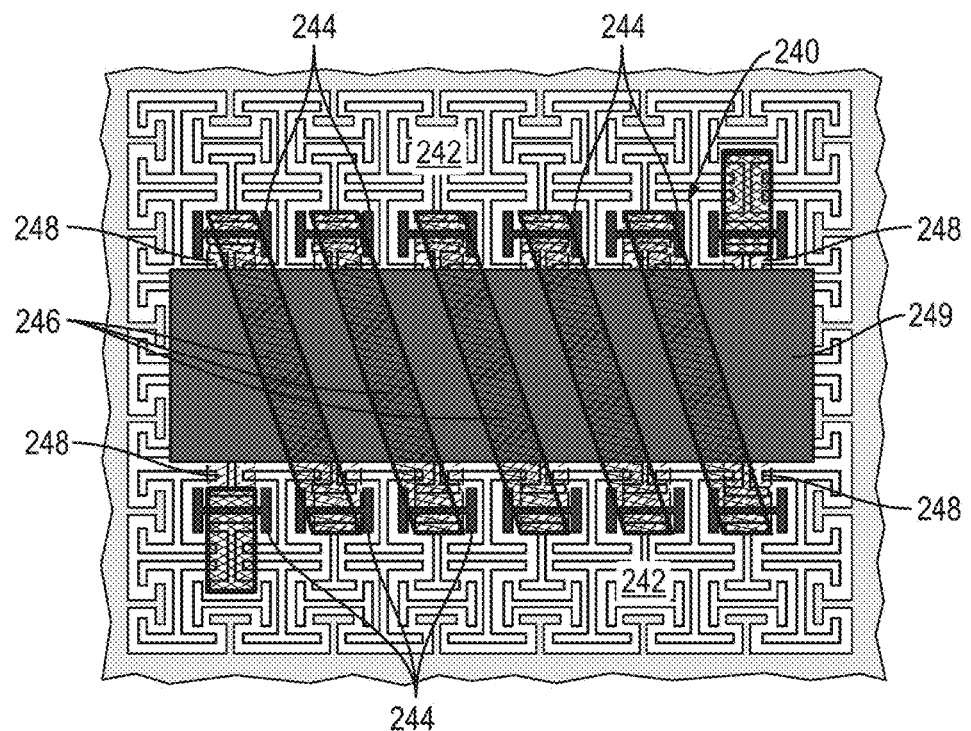

FIG. 24 includes another embodiment in which a solenoid 240 surrounded by an insulating structure 242. The solenoid 240 includes conductive structures 244 and conductive straps 246 and 248 that are similar to the conductive structures 214 and conductive straps 216 and 218 as previously described with respect to the solenoid 210 in FIG. 21. A single structure 249 can include a magnetic material, such as Fe, Co, Ni, or an alloy including Fe, Co, Ni, or any combination thereof. Similar to the solenoid 210, the solenoid 240 includes portions of an insulating layer that may or may not include embedded voids. In the embodiment illustrated, none of a semiconductor substrate is part of the core of the solenoid 240.

Figure 25:
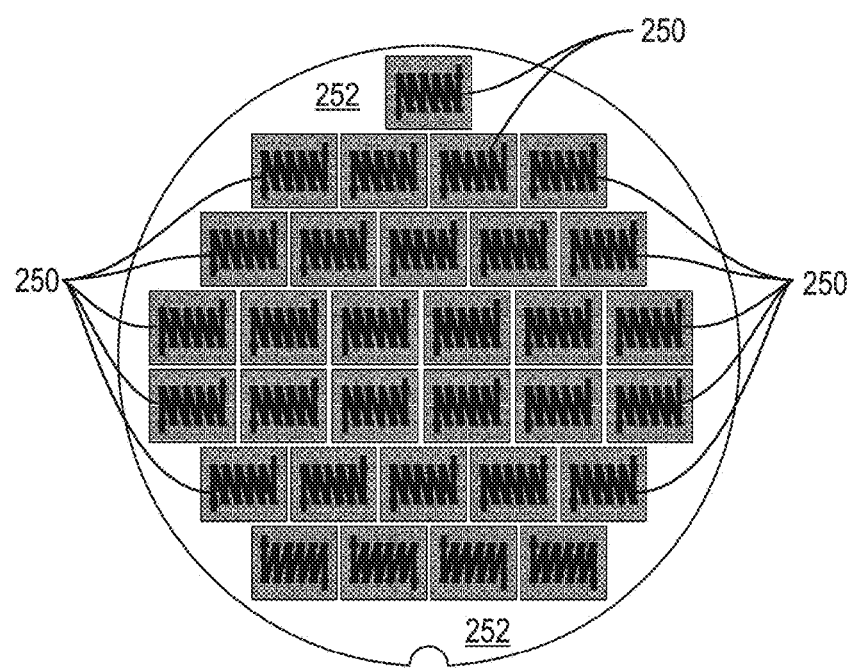
FIG. 25 includes a plan view of discrete inductors in wafer form before singulation.

Referring to FIG. 25, any of the inductors 210, 220, 230, and 240 can be used to form discrete inductors 250 from a substrate 252 in wafer form. An insulating structure, one or more conductive structure, one or more conductive straps, and if a magnetic core is present, one or more structures that include magnetic material are formed. After backgrinding the substrate 252, the remaining portions of a semiconductor substrate lie within dicing lanes and along the periphery of the substrate 252. During singulation, the remaining portions of the substrate are removed. Thus, discrete inductors can be formed from a semiconductor substrate where no portion of the semiconductor substrate remains in the finished discrete inductor. In another embodiment, anchors features and a small portion of the substrate may remain to improve mechanical integrity of the structure.

The concepts as described herein can be used to form electronic devices that include a relatively complex or large conductor or electronic component that is laterally surrounded by an insulating structure. The electronic device may or may not include a portion of a semiconductor substrate that laterally surrounds the electronic component. The insulating structure may allow the conductor or electronic component to be significantly spaced apart from surrounding parts of the substrate, which may include other electronic components. Thus, electrical fields can be reduced and allow for higher voltage electronic devices to be formed. Further, a portion of an electronic device may have a relatively higher magnetic field or generate or be more susceptible to noise. The insulating structure as disclosed herein allows better isolation and reduces adverse effects of the magnetic field or noise.

After reading this specification, skilled artisans will understand that they may have design choices, and therefore, not all of the concepts as described with respect to particular embodiments need to be implemented. Below are some exemplary benefits that are illustrative and not limiting to the scope of the invention.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below Embodiment 1

An electronic device can include a substrate; an insulating structure that is laterally surrounded by the substrate; and a first conductive structure or an active region that is laterally surrounded by the insulating structure and the substrate, wherein the first conductive structure or active region is laterally spaced apart from the substrate by at least 4 microns.

Embodiment 2

The electronic device of Embodiment 1, further including a plurality of insulating pillars embedded within the first conductive structure.

Embodiment 3

The electronic device of Embodiment 1, further including a second conductive structure, wherein the electronic device includes the first conductive structure that is laterally surrounded by the second conductive structure.

Embodiment 4

The electronic device of Embodiment 3, wherein each of the first and second conductive structures is principally (1) an elemental metal or a metal alloy or (2) a semiconductor material, and the first and second conductive structures have different principal compositions.

Embodiment 5

The electronic device of Embodiment 1, wherein the electronic device includes the active region that includes a semiconductor material.

Embodiment 6

The electronic device of Embodiment 5, further including an electronic component within the active region.

Embodiment 7

The electronic device of Embodiment 5, wherein the substrate includes the semiconductor material.

Embodiment 8

An electronic device can include an insulating structure that includes an embedded void; and an inductor laterally surrounded by the insulating structure and having a core that includes an insulating material or a magnetic material and does not include any portion of a semiconductor substrate.

Embodiment 9

The electronic device of Embodiment 8, wherein the inductor is a solenoid.

Embodiment 10

The electronic device of Embodiment 9, wherein the inductor includes a first interconnect and a second interconnect that are parts of a coil, the first interconnect lies along a first side of a die, and the second interconnect lies along a second side of the die that is opposite the first side.

Embodiment 11

The electronic device of Embodiment 8, wherein the inductor is a planar spiral inductor.

Embodiment 12

A process of forming an electronic device can include:
patterning a substrate to define a trench and a plurality of features, including a first feature and a second feature, within the trench;
forming a first insulating layer within the trench;
removing the first feature after forming the first insulating layer to create a first cavity;
forming a second insulating layer to at least partly fill the first cavity;
removing the second feature after forming the first insulating layer to create a second cavity; and
forming a first conductive or semiconductor structure within the second cavity.

Embodiment 13

The process of Embodiment 12, wherein the first or second feature is a pillar.

Embodiment 14

The process of Embodiment 12, further including patterning the first insulating layer to expose the first feature before removing the first feature.

Embodiment 15

The process of Embodiment 12, wherein forming the first insulating layer forms a first embedded void within the first insulating layer, and forming the second insulating layer forms a second embedded void within the second insulating layer.

Embodiment 16

The process of Embodiment 12, wherein the first conductive structure is formed and is a through-substrate via.

Embodiment 17

The process of Embodiment 12, wherein the first conductive structure is formed and is at least part of an inductor.

Embodiment 18

The process of Embodiment 17, wherein:
patterning the substrate is performed so that the plurality of features further includes a third feature;
the process further includes:
  removing the third feature after forming the first insulating layer to create a third cavity;
  forming a second conductive structure within the third cavity; and
  forming an interconnect that contacts and electrically connects the first and second conductive structures.

Embodiment 19

The process of Embodiment 12, wherein the semiconductor structure is formed and includes an active region.

Embodiment 20

The process of Embodiment 19, wherein the substrate and the semiconductor structure include different semiconductor materials.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
a substrate;
an insulating structure that is laterally surrounded by the substrate; and
a first conductive structure or an active region that is laterally surrounded by the insulating structure and the substrate, wherein:
  the first conductive structure or active region is laterally spaced apart from the substrate by at least 4 microns, and
  a plurality of insulating pillars is embedded within the first conductive structure.

2. The electronic device of claim 1, further comprising a second conductive structure, wherein the electronic device includes the first conductive structure that is laterally surrounded by the second conductive structure.

3. The electronic device of claim 2, wherein each of the first and second conductive structures is principally (1) an elemental metal or a metal alloy or (2) a semiconductor material, and the first and second conductive structures have different principal compositions.

4. The electronic device of claim 1, wherein the electronic device includes the active region that includes a semiconductor material.

5. The electronic device of claim 4, further comprising an electronic component within the active region.

6. The electronic device of claim 4, wherein the substrate includes the semiconductor material.

7. The electronic device of claim 1, wherein the first conductive structure is part of an n-axial conductor.

8. The electronic device of claim 7, wherein the n-axial conductor further comprises second conductive structures.

9. The electronic device of claim 8, wherein the second conductive structures are part of an outer ring that is surrounded by the insulating structure.

10. The electronic device of claim 9, wherein the n-axial connector is a coaxial connector.

11. An electronic device comprising:
a substrate;
an insulating structure that includes an embedded void, wherein the insulating structure is within the substrate; and
an inductor laterally surrounded by the insulating structure and having a core that includes an insulating material or a magnetic material and does not include any portion of a semiconductor substrate, wherein the core is within the substrate.

12. The electronic device of claim 11, wherein the inductor is a solenoid.

13. The electronic device of claim 12, wherein the inductor includes a first interconnect and a second interconnect that are parts of a coil, the first interconnect lies along a first side of a die, and the second interconnect lies along a second side of the die that is opposite the first side.

14. The electronic device of claim 11, wherein the inductor is a planar spiral inductor.

15. The electronic device of claim 11, wherein the inductor further comprises conductive structures laterally surrounded by the insulating structure, wherein:
first side interconnects, including the first interconnect, contact the conductive structures along the first side, and
second side interconnects, including the second interconnect, contact the conductive structures along the second side.

16. The electronic device of claim 15, wherein the core only includes one or more insulating materials and one or more voids.

17. The electronic device of claim 15, wherein the core only includes one or more insulating materials.

18. The electronic device of claim 15, wherein the core includes a magnetic material.

19. The electronic device of claim 18, wherein the magnetic material is in a form of structures laterally surrounded by the insulating structure.

20. The electronic device of claim 19, wherein:
the inductor further comprises first side interconnects along a first side of a die, and second side interconnect along a second side of the die that is opposite the first side;
the first side interconnects and the second side interconnects are not electrically connected to the structures that include the magnetic material.

* * * * *